(12) United States Patent
Nagai et al.

(10) Patent No.: US 7,004,522 B2
(45) Date of Patent: Feb. 28, 2006

(54) SUCTION UNIT

(75) Inventors: Shigekazu Nagai, Adachi-ku (JP); Ryuuichi Masui, Iwai (JP)

(73) Assignee: SMC Kabushiki Kaisha, Tokyo (JP)

( * ) Notice: Subject to any disclaimer, the term of this patent is extended or adjusted under 35 U.S.C. 154(b) by 451 days.

(21) Appl. No.: 10/356,541

(22) Filed: Feb. 3, 2003

(65) Prior Publication Data
US 2003/0147736 A1 Aug. 7, 2003

(30) Foreign Application Priority Data
Feb. 4, 2002 (JP) .............................. 2002-027344

(51) Int. Cl.
*B25J 15/06* (2006.01)

(52) U.S. Cl. .................. 294/64.1; 294/907; 414/752.1; 74/45

(58) Field of Classification Search ............... 294/64.1, 294/65, 907; 414/737, 627, 752.1, 744.3; 901/40, 46, 47; 74/25, 45
See application file for complete search history.

(56) References Cited

U.S. PATENT DOCUMENTS

| | | | | |
|---|---|---|---|---|
| 2,850,279 A | * | 9/1958 | Stoothoff et al. | 271/103 |
| 3,112,134 A | * | 11/1963 | Ponsen | 294/1.1 |
| 3,501,026 A | * | 3/1970 | Chase et al. | 414/567 |
| 3,881,362 A | * | 5/1975 | Beezer | 74/53 |
| 4,370,092 A | | 1/1983 | Healy | |
| 5,013,075 A | * | 5/1991 | Littell | 294/64.1 |
| 5,228,732 A | * | 7/1993 | Rauscher | 294/2 |
| 5,649,804 A | * | 7/1997 | Schychuck | 198/750.11 |
| 6,098,478 A | * | 8/2000 | Sandrock | 74/53 |

* cited by examiner

*Primary Examiner*—Dean J. Kramer
(74) *Attorney, Agent, or Firm*—Paul A. Guss

(57) ABSTRACT

A suction unit includes a rotary driving source which is arranged outside of a casing, a substantially oblong circular crank member which is rotatable and which is connected to a rotary shaft of the rotary driving source, a connecting rod which has one end rotatably supported on one end of the crank member, a connecting member on which the other end of the connecting rod is rotatably supported, a shaft which is inserted into the casing and which has a substantially central portion to which the connecting member is connected, and a suction pad which is attached to one end of the shaft and which attracts a workpiece.

25 Claims, 11 Drawing Sheets

SUCTION UNIT

BACKGROUND OF THE INVENTION

1. Field of the Invention

The present invention relates to a suction unit which makes it possible to transport a workpiece by attracting a workpiece with a suction pad and linearly reciprocate the workpiece along a body by a driving source.

2. Description of the Related Art

A fluid pressure cylinder is used for a suction unit for attracting and transporting the workpiece such as a semiconductor chip. Such a fluid pressure cylinder transports a workpiece attracted by a suction pad under the action of a pressure fluid.

A piston is displaced in the axial direction by the pressure fluid which is supplied from one port of the fluid pressure cylinder. A piston rod integrally connected to the piston is displaced in the axial direction. During this process, the suction pad attached to one end of the piston rod abuts against the upper surface of the workpiece. The workpiece is attracted by the suction pad with the negative pressure of the fluid introduced through the interior of the hollow piston rod.

When the pressure fluid is supplied to the other port of the fluid pressure cylinder, the fluid pressure cylinder is displaced upwardly while attracting the workpiece and transports the workpiece.

In the suction unit with the conventional fluid pressure cylinder, the suction pad attracting the minute workpiece such as the semiconductor chip is displaced in the axial direction by the pressure fluid which is supplied to the fluid pressure cylinder. As a result, the piston disposed in the fluid pressure cylinder is driven by the pressure fluid. Therefore, it is difficult to adjust the speed of the suction pad when the suction pad abuts against the upper surface of the workpiece. For this reason, impact may be excessive when the suction pad abuts against the workpiece, and load excessive enough to break the workpiece may be applied thereto.

SUMMARY OF THE INVENTION

A general object of the present invention is to provide a suction unit which makes it possible to reduce the impact exerted on a workpiece by a suction pad when a minute workpiece such as a semiconductor chip is attracted by the suction pad.

According to the present invention, a rotary member is rotated by supplying an electric signal to a rotary driving source. A connecting rod having rotatably supported one end is rotated by the rotation of the rotary member.

Accordingly, a connecting member, on which the other end of the connecting rod is rotatably supported, can be displaced together with a shaft. Therefore, the displacement of the shaft in the axial direction can be controlled by the rotary member which is driven by the rotary driving source. Further, the displacement speed of the shaft can be controlled easily and freely. Therefore, since the displacement speed of the shaft is lowered when a suction pad abuts against a workpiece, it is possible to reduce the impact exerted on the workpiece.

A fluid passage penetrates through the shaft for flowing a pressure fluid. Accordingly, any external pipes for supplying the pressure fluid are unnecessary. Thus, it is possible to reduce a space required for the suction unit.

Further, the suction pad is attached to one end of the shaft for communicating with the fluid passage of the shaft. A plate of a resin material is attached to the surface of the suction pad to abut against the workpiece. Accordingly, when the suction pad abuts against the upper surface of the workpiece, it is possible to prevent the suction pad from sticking to the workpiece.

Further, the rotary member has a projection which protrudes in the axial direction. The position of rotation of the rotary member is detected by detecting the projection with a detecting section which is arranged on a body. Accordingly, it is possible to reliably detect the displacement positions of the shaft and the suction pad.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

Figure 1:
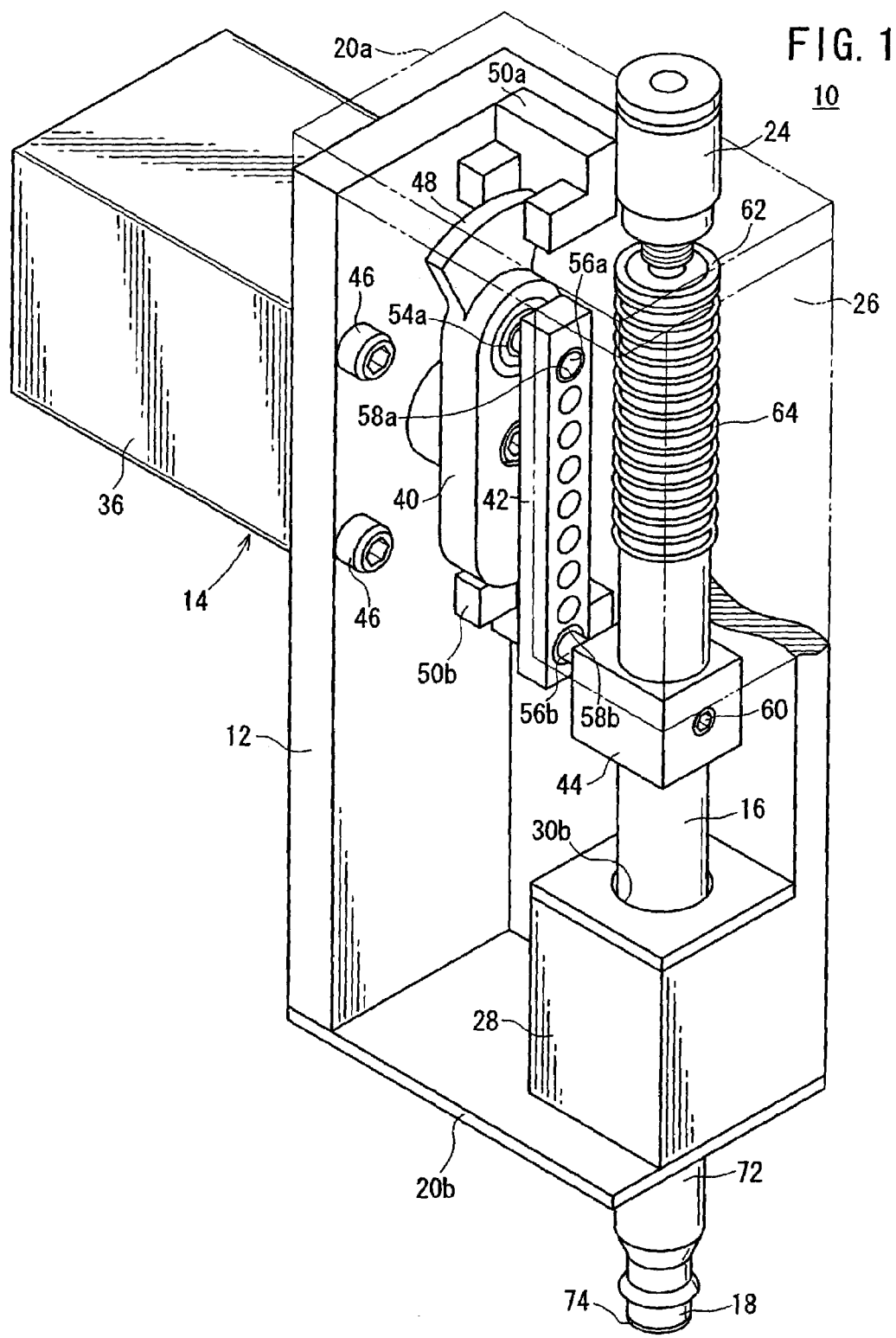
FIG. 1 is, with partial omission, a perspective view illustrating a suction unit according to an embodiment of the present invention.

With reference to FIGS. 1 to 5, reference numeral 10 indicates a suction unit according to an embodiment of the present invention.

The suction unit 10 comprises a casing (body) 12, an electric actuator 14 which is disposed outside of the casing 12 and which is driven by an electric signal, a shaft 16 which is displaceable in the axial direction by the electric actuator 14, and a suction pad 18 which is integrally connected to the end of the shaft 16.

The top and the bottom of the casing 12 are closed by cover members 20a, 20b, respectively. A joint member 24 is screwed in the upper cover member 20a via a hole 22a (see FIG. 2). An unillustrated fluid tube is connected to the joint member 24.

Figure 2:
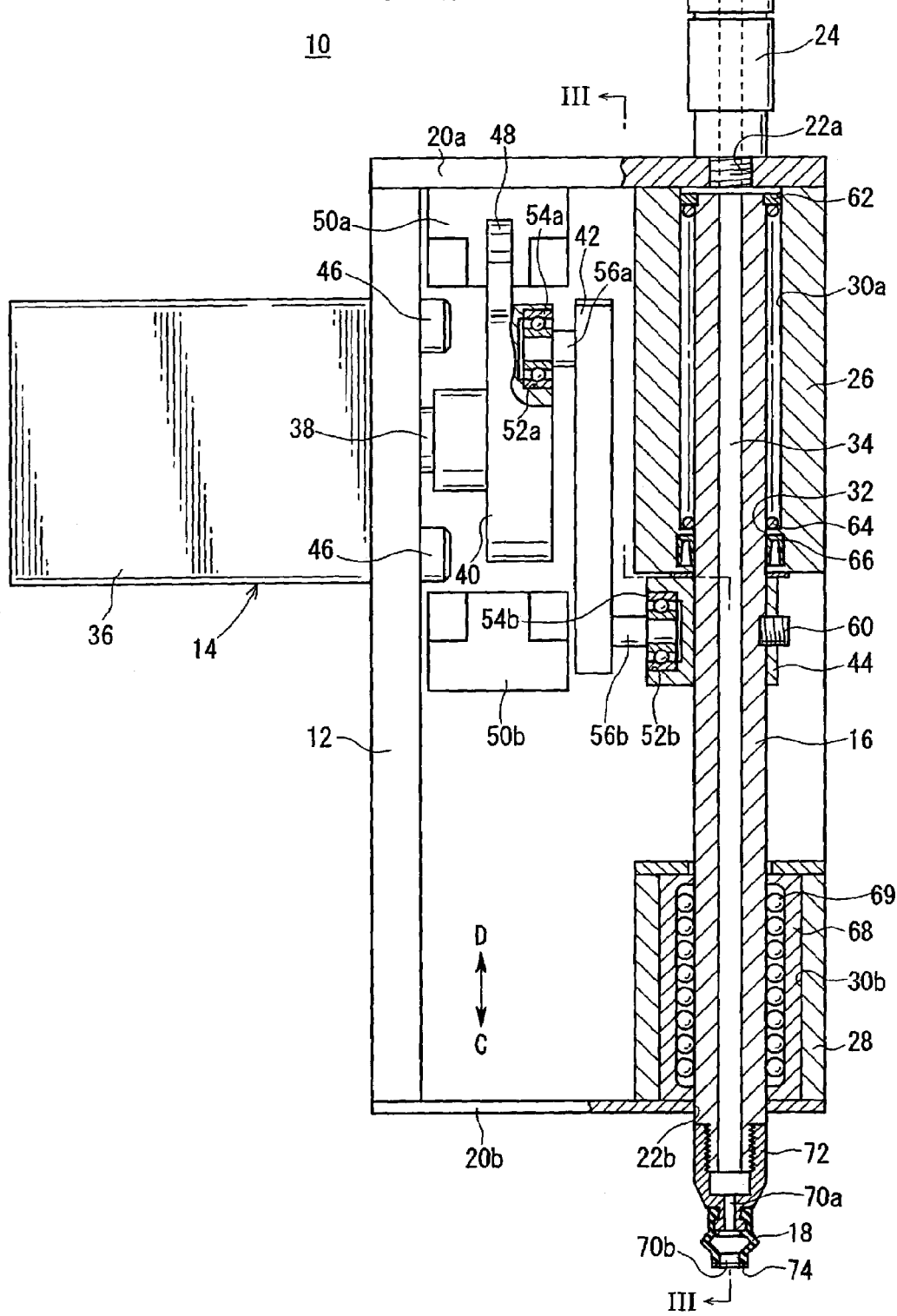
FIG. 2 is a vertical sectional view illustrating a suction unit according to the embodiment of the present invention.

First and second shaft-holding sections 26, 28, each of which has a rectangular parallelepiped shape, are formed along the surface at upper and lower portions in the casing 12 (see FIGS. 1 and 2). The upper surface of the first shaft-holding section 26 and the lower surface of the second shaft-holding section 28 abut against the cover members 20a, 20b respectively. Through-holes 30a, 30b are formed in the first and second shaft-holding sections 26, 28 respectively. The shaft 16 having a hollow shape has one end and the other end which are inserted into the through-holes 30a, 30b respectively. A small diameter section 32, which has a diameter reduced to the same size as that of a diameter of the shaft 16, is formed at a lower portion of the first shaft-holding section 26. A communication passage 34 formed in the shaft 16 penetrates from one end to the other end of the shaft 16. The communication passage 34 communicates with the through-hole 30a of the first shaft-holding section 26 and the internal passage of the joint member 24 (see FIG. 4).

The electric actuator 14 provided on the side surface of the casing 12 comprises a rotary driving source 36 (for example, a motor) which is connected to the side surface of the casing 12 and which makes the rotary driving; a crank member (rotary member) 40 which is connected to a rotary shaft 38 of the rotary driving source 36; a connecting rod 42 which has one end rotatably supported at a portion offset from the center of rotation of the crank member 40; and a connecting member 44 which is rotatably supported by the other end of the connecting rod 42 and which is connected to a substantially central portion of the shaft 16.

The rotary driving source 36 is connected to the side surface of the casing 12 by the bolts 46. The rotary shaft 38 disposed at a substantially central portion of the rotary driving source 36 penetrates through an unillustrated hole formed through the casing 12.

The end of the rotary shaft 38 is connected to a substantially central portion of the oblong circular crank member 40 so that the rotary shaft 38 is rotated together with the crank member 40.

A substantially sectorial projection 48 protruding in the axial direction is formed on one end of the crank member 40 (see FIGS. 1 and 2). When the projection 48 arrives at one of detecting sections 50a, 50b which have substantially L-shaped cross sections and which are arranged on upper and lower portions of the side surface of the casing 12, the angle of rotation of the crank member 40 is detected. The position of displacement of the shaft 16 can be detected by the angle of rotation of the crank member 40.

When the projection 48 arrives at either of the detecting sections 50a, 50b disposed on the upper side or the lower side by the rotation of the crank member 40, the angle of rotation of the crank member 40 is detected by using an unillustrated sensor (for example, an optical sensor in which a light beam emitted from a light-emitting element is detected by a light-receiving sensor) provided on the detecting sections 50a, 50b. As a result, the displacement position of the crank member 40 is identified by the information about the angle of rotation of the crank member 40 previously inputted, for example, into an unillustrated controller.

The mechanism for detecting the angle of rotation of the crank member 40 is not limited to the optical sensor as described above. For example, an unillustrated encoder can be used for the rotary driving source 36.

As shown in FIG. 2, a bearing member 54a is attached to an attachment hole 52a which is formed on one side of the crank member 40. One end of a pin member 56a is rotatably attached into the bearing member 54a. One end of the lengthy connecting rod 42 is connected to the other end of the pin member 56a by the aid of a hole 58a (see FIG. 1).

The connecting rod 42 is rotatable by the pin member 56a inserted into the bearing member 54a.

The other end of the lengthy connecting rod 42 is rotatably supported by the connecting member 44 which is connected to a substantially central portion of the shaft 16 by a pin member 56b inserted into a hole 58b (see FIG. 1). As shown in FIG. 2, a bearing member 54b is attached to an attachment hole 52b of the connecting member 44. One end of the pin member 56b is inserted into the bearing member 54b and the pin member 56b is rotatable. The connecting member 44 is fastened to the substantially central portion of the shaft 16 in the axial direction by a screw member 60.

Figure 3:
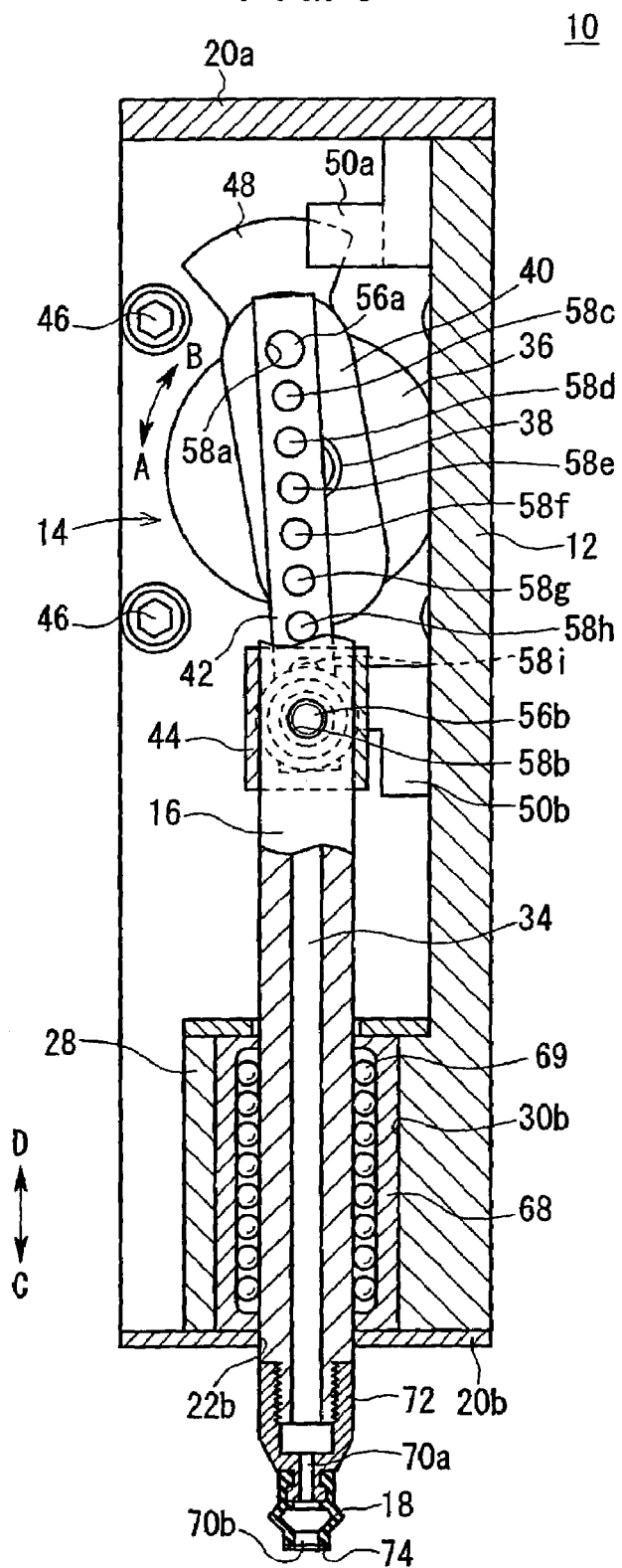
FIG. 3 is a vertical sectional view taken along a line III—III shown in FIG. 2.

As shown in FIG. 3, the connecting rod 42 has a plurality of holes 58c to 58i which are spaced from each other by predetermined distances in the axial direction. The displacement amount of the shaft 16 in the axial direction can be adjusted by changing each of the pin members 56a, 56b to be inserted into one end and the other end of the connecting rod 42 to one of the holes 58c to 58i in the same manner as in the holes 58a, 58b.

An annular ring member 62, which is diametrally expanded radially outwardly, is attached to one end of the shaft 16 to be inserted into the first shaft-holding section 26. The shaft 16 is substantially cylindrical. When the ring member 62 having the diameter (outer diameter) larger than that of the small diameter section 32 is attached to one end of the shaft 16, the shaft 16 is prevented from being disengaged from the through-hole 30a.

A spring member 64 is interposed between the lower surface of the ring member 62 and the step of the through-hole 30a. The spring member 64 urges the shaft 16 so that the shaft 16 is displaced in the direction toward the joint member 24. When the shaft 16 is displaced upwardly, the shaft 16 is displaced upwardly by the spring force of the spring member 64. Therefore, the load on the rotary driving source 36 is reduced. Further, even when no electric signal is supplied to the rotary driving source 36, for example, upon power outage, the shaft 16 is displaced upwardly by the spring force of the spring member 64. Therefore, it is possible to miniaturize the rotary driving source 36.

A seal member 66 having a U-shaped cross section is attached to an annular groove at a lower portion of the through-hole 30a. A lip section of the seal member 66 abuts against the outer circumferential surface of the shaft 16. Thus, air-tightness is retained in the through-hole 30a.

The other end of the shaft 16 is inserted into a linear bush (ball bush) 68 which is attached to the through-hole 30b of the second shaft-holding section 28. The linear bush 68 extends by a predetermined length in the axial direction. The linear bush 68 supports the outer circumferential surface of the shaft 16 by a plurality of balls 69 provided therein and guides the displacement of the shaft 16 in the axial direction.

The other end of the shaft 16 inserted into the linear bush 68 protrudes by a predetermined length to the outside through the hole 22b of the cover member 20b. A suction nozzle 72 is screwed with the end of the shaft 16, and has therein a passage 70a that is diametrally reduced as compared with the communication passage 34. The suction pad 18 of an elastic material such as rubber is attached to the end of the suction nozzle 72. A plate 74 of a resin material is attached to the lower surface of the suction pad 18 to abut against a workpiece. A passage 70b communicating with the communication passage 34 of the shaft 16 via the suction nozzle 72 is formed over substantially central portions of the suction pad 18 and the plate 74. That is, the joint member 24 is communicated with the suction nozzle 72 and the passage 70b in the suction pad 18 via the communication hole of the shaft 16. Therefore, the negative pressure fluid is supplied to the suction pad 18 via the joint member 24 from an unillustrated fluid tube. When the communication passage 34 for the negative pressure fluid is formed in the shaft 16, any pipes connected to the suction pad 18 and the suction nozzle 72 from the outside are unnecessary. Therefore, it is unnecessary to perform any complicated operation for connecting the pipes. The plate 74 has an annular thin plate-shaped configuration.

Further, the space can be saved around the suction unit 10, because it is unnecessary to use the pipes connected to the outside.

In the case of the unillustrated conventional suction apparatus, the workpiece is sometimes stuck to the suction pad of the elastic material even when no negative pressure fluid is supplied to the suction pad. For this reason, in the conventional suction apparatus, the suction pad was made of a resin material in order to prevent the workpiece from being stuck to the suction pad. However, the excessive load is exerted on the workpiece, because the impact force exerted upon the abutment against the workpiece is large compared with the elastic material such as rubber.

Figure 6:
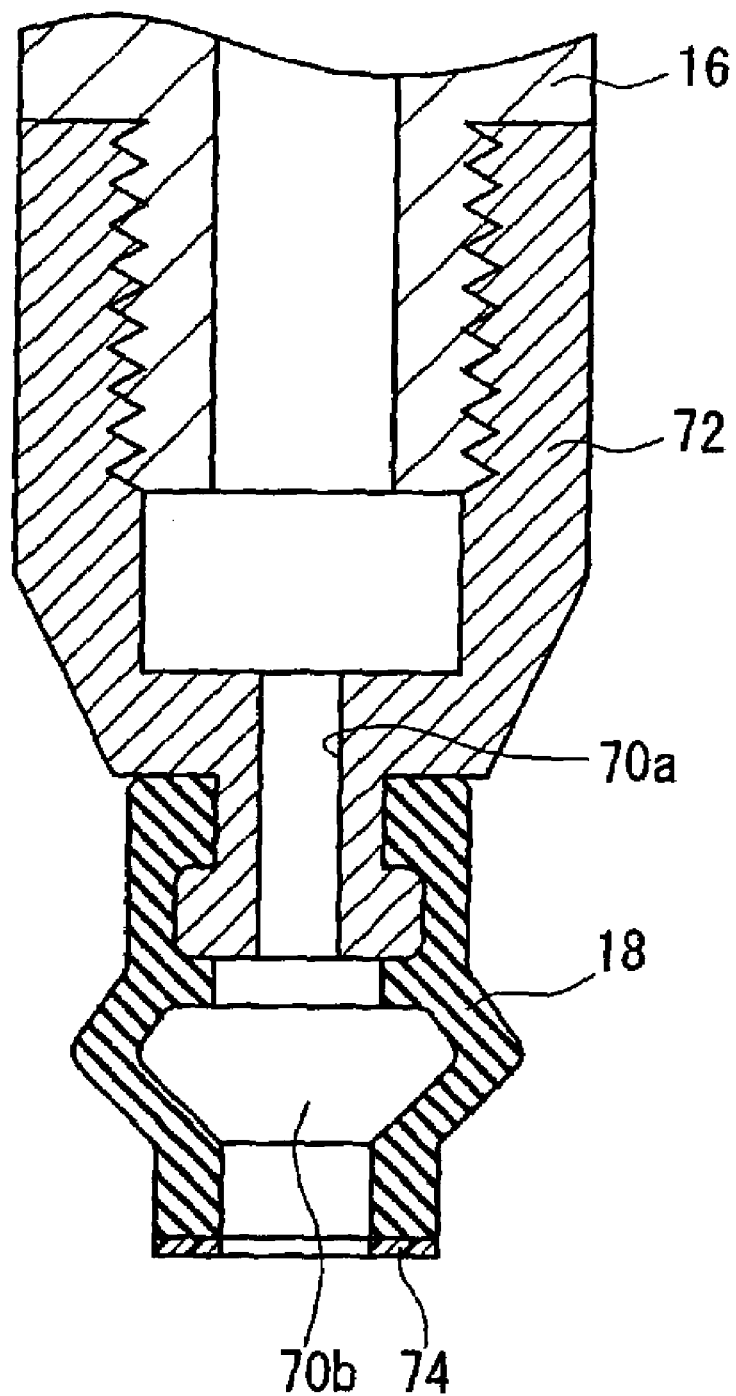
FIG. 6 is a magnified vertical sectional view in the vicinity of a suction pad of the suction unit according to the embodiment of the present invention.

In the embodiment of the present invention, as shown in FIG. 6, the plate 74 of the resin material is attached to the abutment surface of the suction pad 18 of the elastic material to abut against the unillustrated workpiece. Accordingly, it is possible to prevent the workpiece from being stuck to the suction pad 18 of the elastic material. Further, it is possible to absorb and reduce the impact exerted on the workpiece, because the suction pad 18 is formed of the elastic material. When the plate 74 is formed of a conductive resin material, the static electricity charged on the workpiece can be released via the plate 74 when the plate 74 abuts against the workpiece such as a semiconductor chip.

Figure 4:
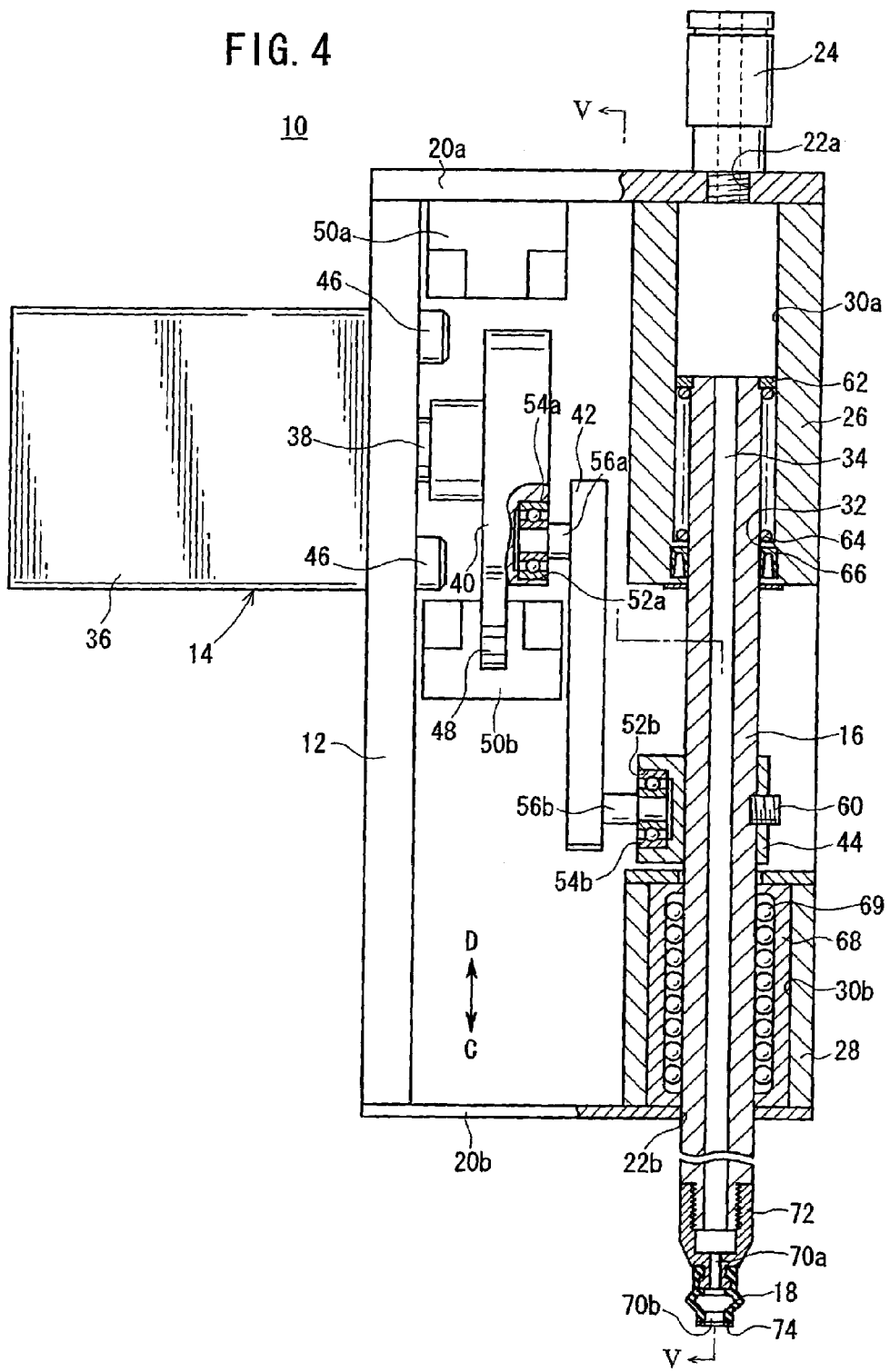
FIG. 4 is a vertical sectional view in which a shaft of the suction unit according to the embodiment of the present invention is displaced downwardly.

As shown in FIGS. 1, 2, and 4, the rotary driving source 36 (for example, a pulse motor or a stepping motor) is fixed to the side of the casing 12 by the bolts 46.

The suction unit 10 according to the embodiment of the present invention is basically constructed as described above. Next, its operation, function, and effect will be explained.

At first, an electric signal (pulse signal) is outputted to the rotary driving source 36 from an unillustrated power source by an unillustrated controller or the like. Accordingly, the rotary shaft 38 of the rotary driving source 36 is rotated by the outputted electric signal.

As shown in FIG. 3, when the rotary shaft 38 is rotated, the crank member 40 is rotated by a predetermined angle, for example, in the counterclockwise direction (direction of the arrow A) about the center of the rotary shaft 38.

The connecting rod 42, which is rotatably supported by the crank member 40 and the pin member 56a, has one end which is rotated along with the locus of rotation of the crank member 40 about the support point of the pin member 56a by the rotation of the crank member 40.

During this process, the other end of the connecting rod 42 is rotatably supported on the connecting member 44 by the pin member 56b. Therefore, one end of the crank member 40 on which the connecting rod 42 is rotatably supported is displaced downwardly by the rotation, and then one end of the connecting rod 42 is displaced downwardly.

Figure 5:
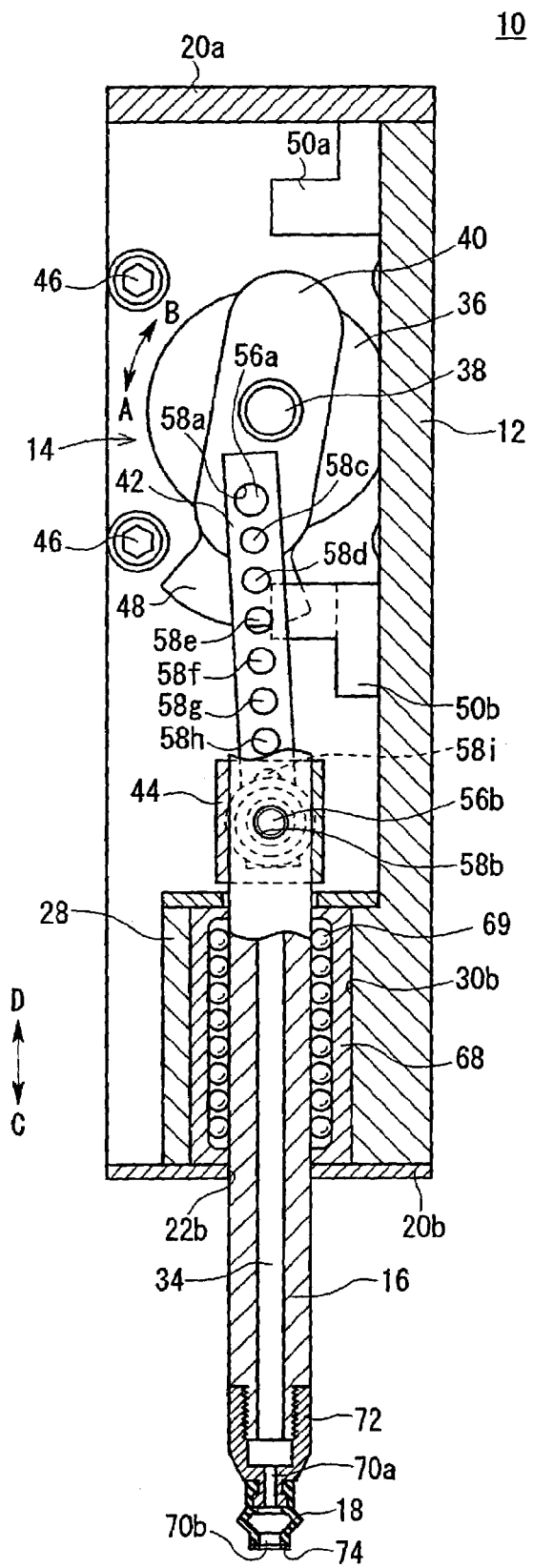
FIG. 5 is a vertical sectional view taken along a line V—V shown in FIG. 4.

As shown in FIG. 4, the shaft 16 is displaced in the downward direction (direction of the arrow C) against the spring force of the spring member 64 by the connecting member 44 when the connecting rod 42 is displaced. During this process, as shown in FIG. 5, the projection 48, which is formed on the crank member 40, arrives at the detecting section 50b disposed on the lower side. Accordingly, the displacement positions of the crank member 40 and the shaft 16 are detected by the unillustrated sensor.

When one end of the crank member 40 on which the connecting rod 42 is rotatably supported is displaced downwardly, and the connecting rod 42 and the crank member 40 are disposed substantially on a straight line, then the shaft 16 is displaced to arrive at the lower end position. The suction pad 18, which is attached to the end of the shaft 16, abuts against the upper surface of the unillustrated workpiece.

During this process, when one end of the crank member 40, on which the connecting rod 42 is rotatably supported, is displaced to the lowermost end in the locus of rotation (at the bottom dead center), the crank member 40, which is rotated by the rotation of the rotary shaft 38, has a rotational acceleration of zero. Therefore, no impact is exerted on the workpiece when the suction pad 18 abuts against the workpiece. Similarly, the crank member 40, which is rotated by the rotation of the rotary shaft 38, also has a rotational acceleration of zero when one end of the crank member 40, on which the connecting rod 42 is rotatably supported, is displaced to the uppermost end in the locus of rotation (at the top dead center).

The suction pad 18, which is attached to the end of the shaft 16, abuts against the upper surface of the unillustrated workpiece when the shaft 16 is displaced. The negative pressure fluid is introduced into the communication passage 34 of the shaft 16 via the unillustrated fluid tube which is connected to the joint member 24. The negative pressure fluid is introduced into the passage 70b of the suction pad 18 via the suction nozzle 72. The unillustrated workpiece is attracted under the action of the negative pressure fluid.

Subsequently, the characteristic of the current to be supplied to the rotary driving source 36 is reversed to the above after attracting the unillustrated workpiece with the suction pad 18 by the action of the negative pressure fluid. Accordingly, the crank member 40 is rotated by a predetermined angle in the clockwise direction (direction of the arrow B).

As shown in FIG. 3, one end of the connecting rod 42, which is rotatably supported on one end of the crank member 40, is rotated and displaced from the lower position to the upper position by the rotation of the crank member 40. Accordingly, the shaft 16 is displaced in the upward direction (direction of the arrow D) from the lower side by the connecting member 44 when the connecting rod 42 is displaced. The shaft 16 is displaced upwardly while retaining the attraction of the unillustrated workpiece with the suction pad 18.

During this process, as shown in FIG. 3, the projection 48, which is formed on the crank member 40, arrived at the detecting section 50a disposed on the upper side. Accordingly, the displacement positions of the crank member 40 and the shaft 16 are detected by the unillustrated sensor.

When one end of the crank member 40 on which the connecting rod 42 is rotatably supported is displaced upwardly, and the connecting rod 42 and the crank member 40 are disposed substantially on a straight line, then the shaft 16 arrives at the upper end position of the displacement. The unillustrated workpiece is transported by the suction pad 18 which is attached to the end of the shaft 16.

That is, the rotary motion of the crank member 40 can be converted into the rectilinear motion of the shaft 16 to move in the vertical direction (direction of the arrows C, D) by the connecting rod 42 and the connecting member 44 under the rotation of the rotary driving source 36.

In the embodiment of the present invention, the shaft 16 is displaced upwardly and downwardly in the axial direction. However, the shaft 16 can be also positioned at an arbitrary intermediate position highly accurately and easily by controlling the rotary driving source 36 based on the electric signal.

As described above, in the embodiment of the present invention, the number of revolutions and the angle of rotation of the rotary driving source 36 can be controlled highly accurately by controlling the rotary driving source 36 based on the electric signal. As a result, the displacement speed of the shaft 16 in the axial direction can be controlled easily and freely by the connecting rod 42 under the rotation of the crank member 40 effected by the rotary driving source 36. Therefore, the impact exerted on the workpiece can be further reduced by decelerating the displacement speed of the shaft 16 by using the deceleration signal supplied from the unillustrated controller when the suction pad 18 abuts against the workpiece.

Further, the shaft 16 can be positioned highly accurately at a desired position by highly accurately controlling the number of revolutions and the angle of rotation of the rotary driving source 36.

If the crank member 40 connected to the rotary shaft 38 has a substantially oblong circular shape, one end of the connecting rod 42 is rotatably supported by one end of the crank member 40, and the shaft 16 is connected to the other end of the connecting rod 42, then the crank member 40, which is rotated by the rotation of the rotary shaft 38, has the rotational acceleration of zero where one end of the crank member 40 is displaced to the lowermost end on the locus of rotation (at the bottom dead center). Therefore, it is possible to reduce the impact exerted when the suction pad 18, which is attached to the end of the shaft 16, abuts against the workpiece.

Further, the plate 74 of the resin material is attached to the abutment surface of the suction pad 18 of the elastic material to abut against the unillustrated workpiece. Accordingly, the workpiece is prevented from being stuck to the suction pad 18. Further, the impact exerted on the workpiece can be absorbed and reduced, because the suction pad 18 is formed of the elastic material.

Further, the components or parts can be detached from the casing 12 and the maintenance thereof can be performed such that the first and second shaft-holding sections 26, 28 and the connecting member 44 remain attached to the shaft 16.

Figure 7:
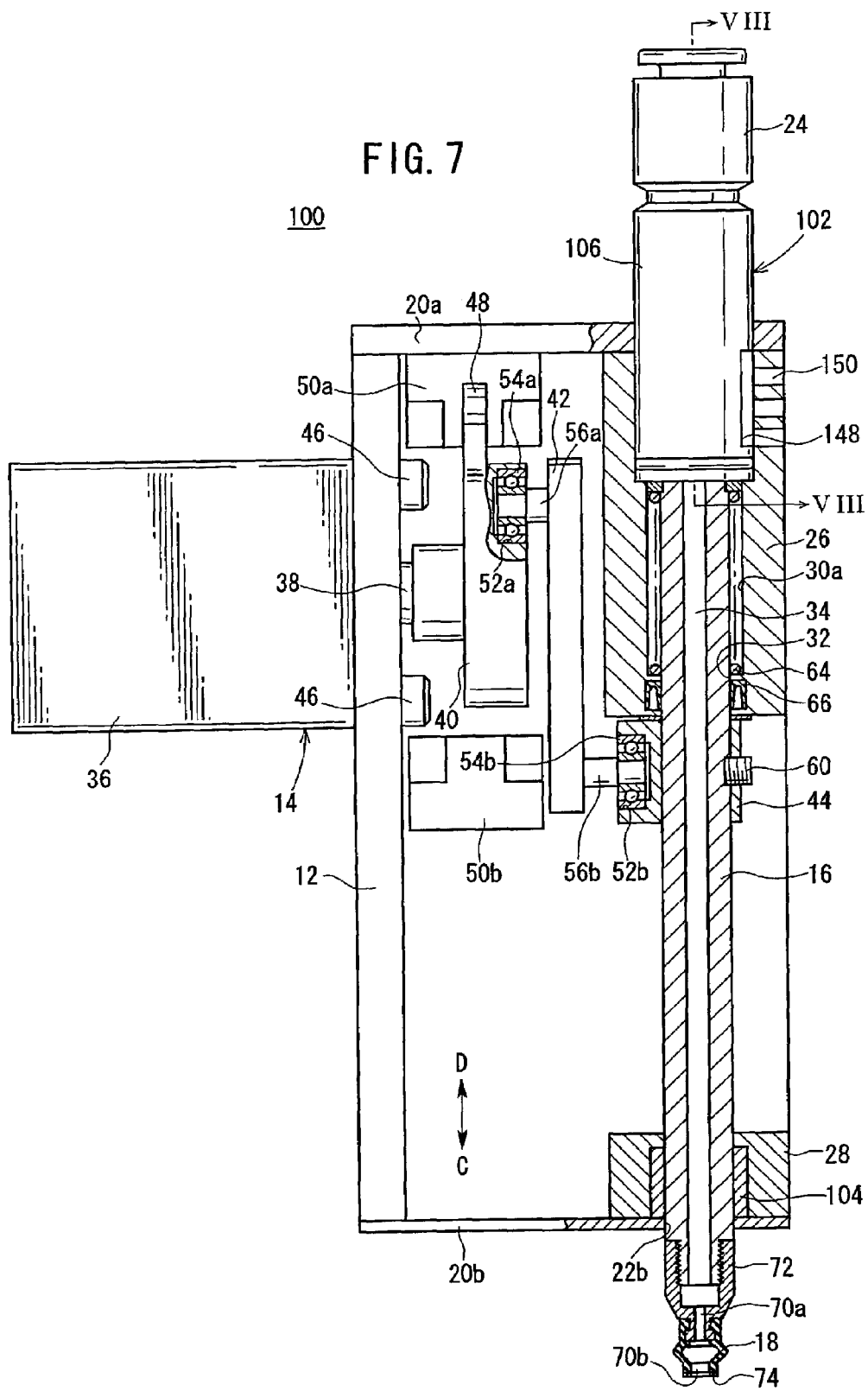
FIG. 7 is a vertical sectional view illustrating a suction unit according to another embodiment of the present invention.

Next, FIG. 7 shows a suction unit 100 according to another embodiment of the present invention. The constitutive components that are the same as those of the suction unit 10 shown in FIG. 1 are designated by the same reference numerals, and detailed explanation thereof will be omitted.

In the suction unit 10 shown in FIG. 1, the negative pressure fluid is supplied from the negative pressure-generating source such as an unillustrated vacuum pump connected to the joint member 24 via the tube or the like. In contrast, the suction unit 100 according to another embodiment shown in FIG. 7 is different from the suction unit 10 in that an ejector 102 is arranged as a negative pressure-generating mechanism between the joint member 24 and the shaft 16.

In other words, the suction unit 10 shown in FIG. 1 is of the vacuum pump-equipped type. In contrast, the suction unit 100 shown in FIG. 7 is of the ejector-equipped type.

In the suction unit 10 shown in FIG. 1, the ball bush (linear bush) 68 is provided in order to guide the vertical rectilinear motion of the shaft 16. In contrast, in the suction unit 100 according to the another embodiment shown in FIG. 7, a sliding bearing member 104, which is composed of a cylindrical member to surround the outer circumferential surface of the shaft 16, is provided in the second shaft-holding section 28. When the sliding bearing member 104 is used, it is possible to miniaturize the whole unit.

Figure 8:
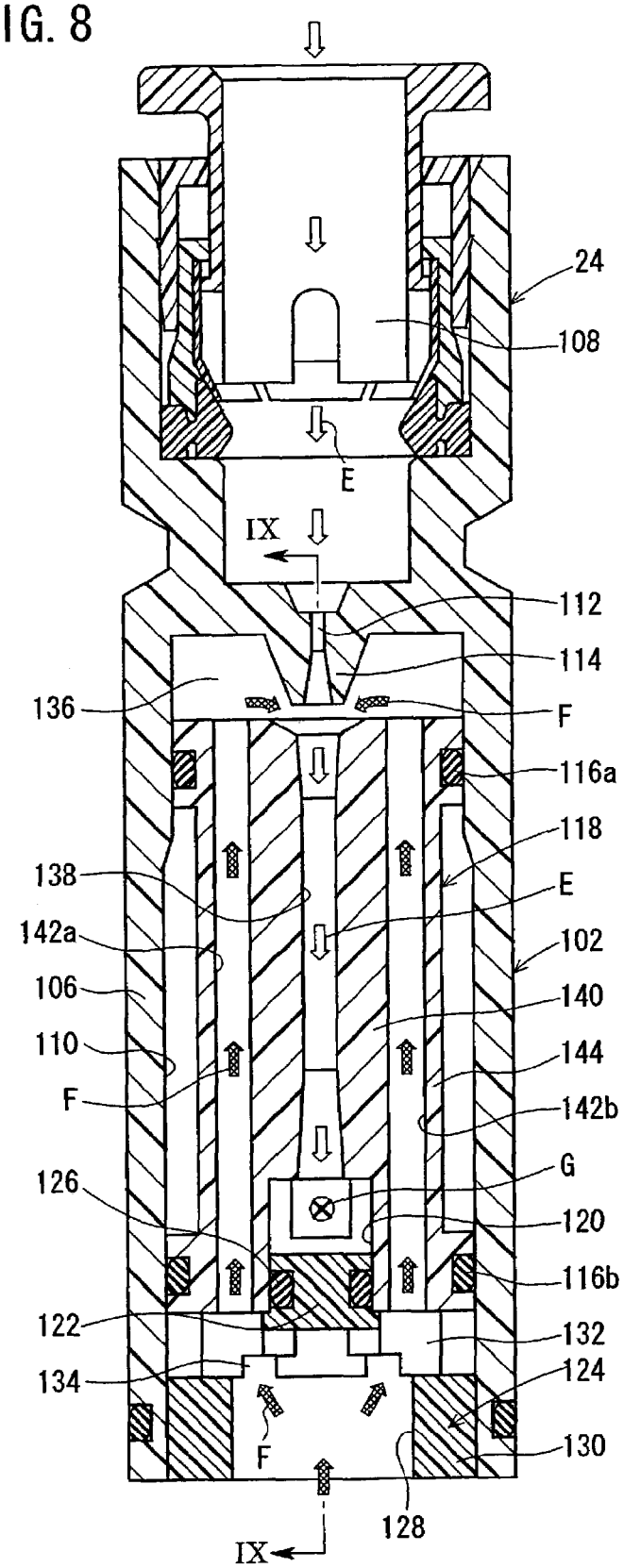
FIG. 8 is a vertical sectional view taken along a line VIII—VIII shown in FIG. 7.

As shown in FIG. 8, the ejector 102 has a cylindrical ejector body 106 which is composed of a resin material and which is formed integrally with the joint member 24. The ejector body 106 is connected to the end of the shaft 16. A nozzle section 114, which has a nozzle hole 112 for communicating with an internal passage 108 of the joint member 24 and a space section 110, is integrally formed at an intermediate portion of the ejector body 106. In the space section 110 of the ejector body 106, there are a diffuser member 118 having both ends to which a pair of seal rings 116a, 116b are attached, and a cap member 124 formed with a projection 122 which has a circular cross section to close a hole 120 formed at the end of the diffuser member 118.

Figure 10:
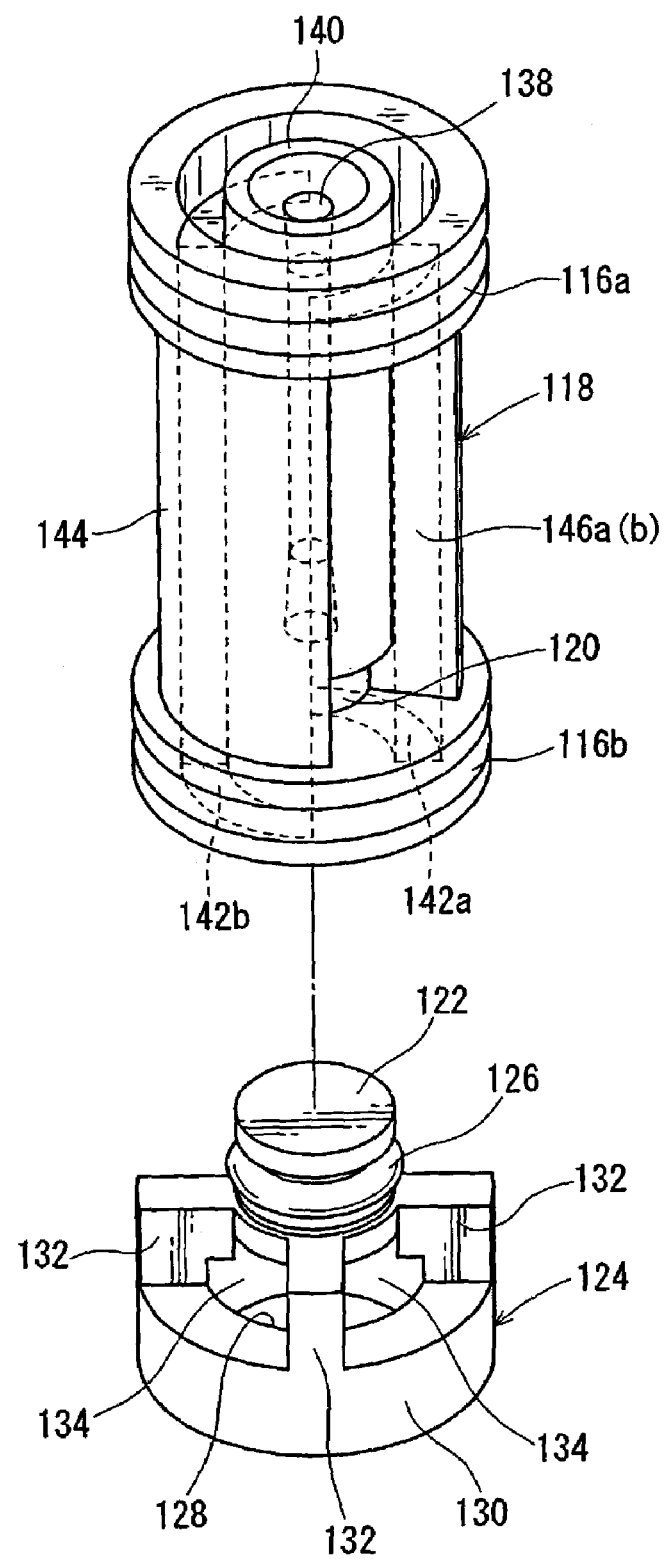
FIG. 10 is an exploded perspective view illustrating a diffuser member and a cap member of an ejector shown in FIG. 7.

A seal ring 126 is attached to an annular groove of the projection 122 of the cap member 124. As shown in FIG. 10, the cap member 124 has an annular section 130 which is formed with a circular hole 128, and a plurality of bent support sections 132 which connect the annular section 130 and the projection 122. Gaps 134, which are communicated with the hole 128, are formed between the adjoining support sections 132.

Figure 9:
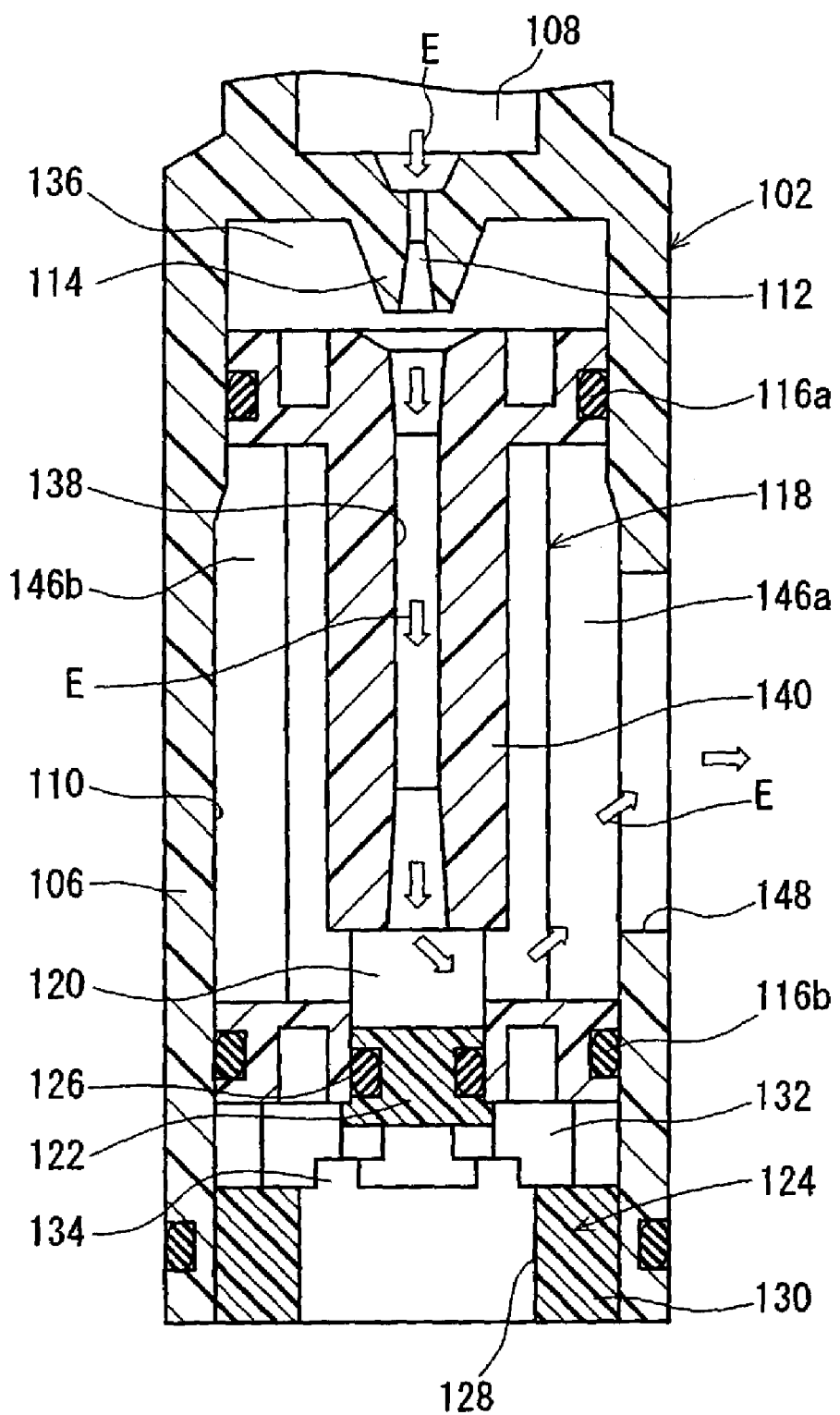
FIG. 9 is a vertical sectional view taken along a line IX—IX shown in FIG. 8.

The nozzle section 114 and the diffuser section 118 are spaced from each other by a predetermined distance in a suction chamber 136 which is surrounded by the inner wall surface of the ejector body 106 and the end surface of the diffuser member 118 (see FIGS. 8 and 9).

Figure 11:
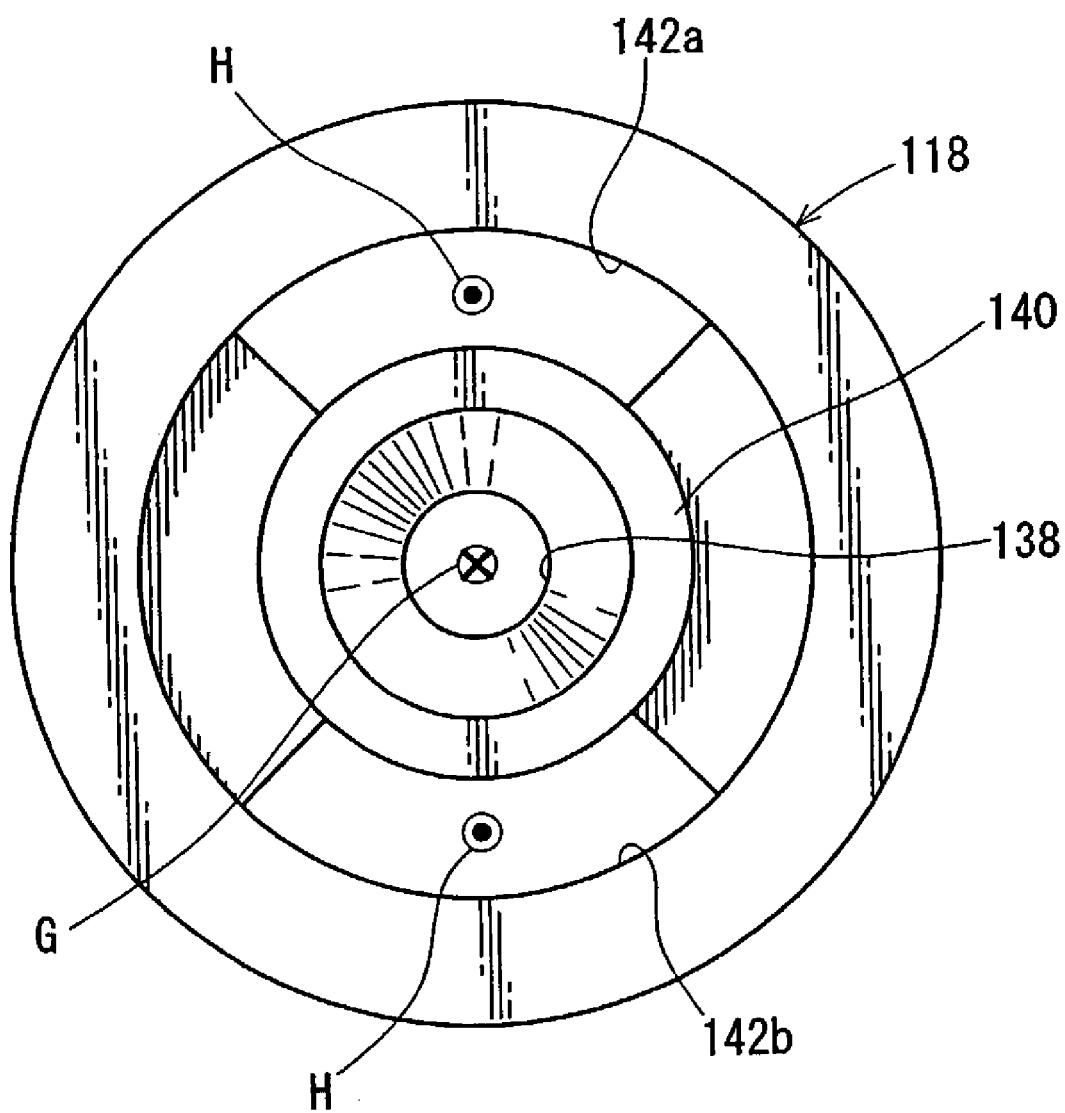
FIG. 11 is a plan view illustrating the diffuser member shown in FIG. 10.

As shown in FIGS. 8, 10, and 11, the diffuser member 118 has a first cylindrical section 140 which has a small diameter and which is formed with a through-hole 138 disposed coaxially with the nozzle hole 112, and a second cylindrical section 144 which has a large diameter and which is formed with a pair of suction passages 142a, 142b having circular arc-shaped cross sections to penetrate in the axial direction. One end of each of the suction passages 142a, 142b is communicated with the suction chamber 136 which the nozzle section 114 and the diffuser member 118 face. The other end is communicated with the hole 128 via the gap 134 of the cap member 124.

Further, as shown in FIGS. 9 and 10, the diffuser member 118 has a pair of discharging openings 146a, 146b which are formed by cutting out parts of the second cylindrical section 144 and which are communicated with the hole 120 closed by the projection 122 of the cap member 124. The discharging openings 146a, 146b are communicated with a hole 148 which is formed in the ejector body 106 and a plurality of slits 150 which are formed through the first shaft-holding section 26. The air, which has passed through the ejector 102, is discharged to the atmosphere via the discharging openings 146a, 146b, the hole 148, and the slits 150.

When all of the ejector body 106, the diffuser member 118, the cap member 124, and other components of the ejector 102 are made of resin materials, it is possible to reduce weight. Further, it is possible to displace, at a much higher speed, the suction pad 18 for attracting the workpiece.

A schematic operation of the ejector 102 will be explained. The air is supplied to the internal passage 108 of the joint member 24 by an unillustrated air supply source. The air is jetted from the nozzle hole 112 of the nozzle section 114. The air is supplied along the through-hole 138 of the diffuser member 118 which is formed coaxially with the nozzle hole 112. The air, which arrives at the hole 120 from the end of the through-hole 138, is discharged to the atmosphere via the discharging openings 146a, 146b which are communicated while being bent from the hole 120, the hole 148 which is formed in the ejector body 106, and the slits 150 which are formed through the first shaft-holding section 26 as shown in FIG. 9.

On the other hand, when the air is jetted from the nozzle hole 112 toward the through-hole 138 of the diffuser member 118, the negative pressure is generated in the suction chamber 136 which the nozzle section 112 and the diffuser member 118 face. The nozzle section 112 and the diffuser member 118 are spaced from each other by the predetermined distance. Therefore, the air is sucked from the side of the suction pad 18 via the suction passages 142a, 142b which are communicated with the suction chamber 136, the gaps 134 of the cap member 124, the hole 128, and the communication passage 34 of the shaft 16.

In FIGS. 8 and 9, the arrows E indicate that the air has the positive pressure, and the arrows F indicate that the air has the negative pressure. In FIGS. 8 and 11, the reference symbol G indicates the direction of the flow of the air (positive pressure) from the front toward the back of the paper of the drawing, and the reference symbol H indicates the direction of the flow of the air (negative pressure) from the back toward the front of the paper of the drawing.

The other function and effect of the suction unit 100 according to the another embodiment are the same as those of the suction unit 10 shown in FIG. 1, and detailed explanation thereof is omitted.

While the invention has been particularly shown and described with reference to preferred embodiments, it will be understood that variations and modifications can be effected thereto by those skilled in the art without departing from the spirit and scope of the invention as defined by the appended claims.

What is claimed is:

1. A suction unit provided with a suction mechanism for attracting a workpiece at one end of a shaft attached in a body, said suction unit comprising:
    a rotary driving source which is provided with said body and which is driven by an electric signal;
    a rotary member which is connected to a rotary shaft of said rotary driving source and which is rotated integrally with said rotary shaft;
    a connecting rod which has one end rotatably supported on a portion of said rotary member offset from a center of rotation of said rotary member;
    a connecting member on which the other end of said connecting rod spaced by a predetermined distance from said one end of said connecting rod in an axial direction is rotatably supported and which is connected to a shaft inserted into said body, wherein said rotary member is rotated by said rotary driving source, and said shaft reciprocates along said axial direction by said connecting rod;
    a first shaft-holding section disposed at one end of said body for slidably supporting one end of said shaft, and a spring disposed in said first shaft-holding section surrounding said one end of said shaft, said spring biasing said shaft in a direction for urging said shaft inside said body;
    a second shaft-holding section disposed at another end of said body for slidably supporting another end of said shaft, and a guide mechanism disposed in said second shaft-holding section surrounding the other end of said shaft for guiding displacement of said shaft, wherein a distal part of said other end of said shaft projects from one end of said body; and
    means for introducing a negative pressure fluid into said first shaft-holding section, such that when said shaft is displaced, said negative pressure fluid communicates via said first shaft-holding section with a fluid passage that penetrates through said shaft.

2. The suction unit according to claim 1, wherein a suction pad is attached to said distal part of said other end of said shaft for communicating with said fluid passage of said shaft, and a plate of a resin material is attached to a surface of said suction pad for abutting against said workpiece.

3. The suction unit according to claim 1, wherein said rotary member has a projection which protrudes in said axial direction, and a position of rotation of said rotary member is detected by detecting said projection with a detecting section provided on said body.

4. The suction unit according to claim 1, wherein said rotary member comprises a crank member which has a substantially oblong circular shape.

5. The suction unit according to claim 1, wherein said connecting rod has a plurality of holes which are spaced from each other by predetermined distances in order to adjust a displacement amount of said shaft in said axial direction.

6. The suction unit according to claim 1, wherein an ejector is integrally connected to said shaft.

7. The suction unit according to claim 6, wherein said ejector includes an ejector body integrally connected to an end of said shaft, and a diffuser member and a cap member which are disposed in said ejector body, and wherein all of said ejector body, said diffuser member, and said cap member are made of a resin material.

8. The suction unit according to claim 1, wherein said guide mechanism comprises at least one of a ball bush and a sliding bearing member.

9. A suction unit provided with a suction mechanism for attracting a workpiece at one end of a shaft attached in a body, said suction unit comprising:
    a rotary driving source which is provided with said body and which is driven by an electric signal;
    a rotary member which is connected to a rotary shaft of said rotary driving source and which is rotated integrally with said rotary shaft;
    a connecting rod which has one end rotatably supported on a portion of said rotary member offset from a center of rotation of said rotary member; and
    a connecting member on which the other end of said connecting rod spaced by a predetermined distance from said one end of said connecting rod in an axial direction is rotatably supported and which is connected to a shaft inserted into said body, wherein said rotary member is rotated by said rotary driving source, and said shaft reciprocates along said axial direction by said connecting rod,
    wherein said rotary member has a projection which protrudes in said axial direction, and a position of rotation of said rotary member is detected by detecting said projection with a detecting section provided on said body.

10. The suction unit according to claim 9, wherein a fluid passage penetrates through said shaft for flowing a pressure fluid.

11. The suction unit according to claim 10, wherein a suction pad is attached to said one end of said shaft for communicating with said fluid passage of said shaft, and a plate of a resin material is attached to a surface of said suction pad for abutting against said workpiece.

12. The suction unit according to claim 9, wherein said rotary member comprises a crank member which has a substantially oblong circular shape.

13. The suction unit according to claim 9, wherein said connecting rod has a plurality of holes which are spaced from each other by predetermined distances in order to adjust a displacement amount of said shaft in said axial direction.

14. The suction unit according to claim 9, wherein an ejector is integrally connected to said shaft.

15. The suction unit according to claim 14, wherein said ejector includes an ejector body integrally connected to an end of said shaft, and a diffuser member and a cap member which are disposed in said ejector body, and wherein all of said ejector body, said diffuser member, and said cap member are made of a resin material.

16. The suction unit according to claim 9, wherein said body is provided with a guide mechanism which guides said shaft that is displaceable in said axial direction.

17. The suction unit according to claim 16, wherein said guide mechanism is composed of at least any one of a ball bush and a sliding bearing member.

18. A suction unit provided with a suction mechanism for attracting a workpiece at one end of a shaft attached in a body, said suction unit comprising:
 a rotary driving source which is provided with said body and which is driven by an electric signal;
 a rotary member which is connected to a rotary shaft of said rotary driving source and which is rotated integrally with said rotary shaft;
 a connecting rod which has one end rotatably supported on a portion of said rotary member offset from a center of rotation of said rotary member;
 a connecting member on which the, other end of said connecting rod spaced by a predetermined distance from said one end of said connecting rod in an axial direction is rotatably supported and which is connected to a shaft inserted into said body, wherein said rotary member is rotated by said rotary driving source, and said shaft reciprocates along said axial direction by said connecting rod; and
 an ejector which is integrally connected to said shaft, wherein said ejector includes an ejector body integrally connected to an end of said shaft, and a diffuser member and a cap member which are disposed in said ejector body, and wherein all of said ejector body, said diffuser member, and said cap member are made of a resin material.

19. The suction unit according to claim 18, wherein a fluid passage penetrates through said shaft for flowing a pressure fluid.

20. The suction unit according to claim 19, wherein a suction pad is attached to said one end of said shaft for communicating with said fluid passage of said shaft, and a plate of a resin material is attached to a surface of said suction pad for abutting against said workpiece.

21. The suction unit according to claim 18, wherein said rotary member has a projection which protrudes in said axial direction, and a position of rotation of said rotary member is detected by detecting said projection with a detecting section provided on said body.

22. The suction unit according to claim 18, wherein said rotary member comprises a crank member which has a substantially oblong circular shape.

23. The suction unit according to claim 18, wherein said connecting rod has a plurality of holes which are spaced from each other by predetermined distances in order to adjust a displacement amount of said shaft in said axial direction.

24. The suction unit according to claim 18, wherein said body is provided with a guide mechanism which guides said shaft that is displaceable in said axial direction.

25. The suction unit according to claim 24, wherein said guide mechanism is composed of at least any one of a ball bush and a sliding bearing member.

* * * * *